(12) United States Patent
Oda et al.

(10) Patent No.: US 11,844,277 B2
(45) Date of Patent: Dec. 12, 2023

(54) VIBRATING ACTUATOR HAVING CONTACT PART WITH HIGH ABRASION RESISTANCE

(71) Applicant: CANON KABUSHIKI KAISHA, Tokyo (JP)

(72) Inventors: Yuki Oda, Kanagawa (JP); Satoshi Tsuchiya, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/860,006

(22) Filed: Jul. 7, 2022

(65) Prior Publication Data

US 2023/0031934 A1 Feb. 2, 2023

(30) Foreign Application Priority Data

Jul. 30, 2021 (JP) .................. 2021-125343

(51) Int. Cl.
*H10N 30/20* (2023.01)
*H02N 2/10* (2006.01)
*H02N 2/12* (2006.01)
*H10N 30/88* (2023.01)

(52) U.S. Cl.
CPC ......... *H10N 30/2027* (2023.02); *H02N 2/103* (2013.01); *H02N 2/12* (2013.01); *H10N 30/88* (2023.02)

(58) Field of Classification Search
CPC .... H10N 30/2027; H10N 30/88; H02N 2/103; H02N 2/12; H02N 2/007; H02N 2/163
See application file for complete search history.

(56) References Cited

U.S. PATENT DOCUMENTS

| 10,527,815 | B2 * | 1/2020 | Kobayashi | H02N 2/12 |
| 11,515,811 | B2 * | 11/2022 | Tsuchiya | H02N 2/163 |
| 2003/0041435 | A1 * | 3/2003 | Kitajima | H02N 2/007 |
| | | | | 29/527.3 |

FOREIGN PATENT DOCUMENTS

JP 2000-245175 A 9/2000

* cited by examiner

*Primary Examiner* — Emily P Pham
(74) *Attorney, Agent, or Firm* — Canon U.S.A., Inc. I.P. Division (57) ABSTRACT

A vibrating actuator includes a contact body and a vibrating body that vibrates, has an energy conversion element, and has an elastic body in contact with the contact body to move relative to each other from the vibration. The contact body has a base part, a thin plate part, a support part, and a friction member. The thin plate part extends from the base part toward an annular center axis of the base part and the support part is disposed at an end of the thin plate part. The friction member is disposed to the support part as a member separate from the support part and in contact with the elastic body. Density of the friction member is higher than density of the thin plate part. A weight ratio of the thin plate part to a total weight of the friction member and the support part is 0.5 to 1.5.

10 Claims, 9 Drawing Sheets

LENGTH L AND NATURAL VIBRATION FREQUENCY OF THIN PLATE PART 2b

FIG.5B

LENGTH L AND NATURAL VIBRATION FREQUENCY OF THIN PLATE PART 2b

VIBRATING ACTUATOR HAVING CONTACT PART WITH HIGH ABRASION RESISTANCE

BACKGROUND

Field

The present disclosure relates to a vibrating actuator that frictionally drives a driven body by pressure contact with a vibrating body, in particular, to a structure of a contact body in a vibrating actuator.

Description of the Related Art

A vibrating actuator has a vibrating body that is formed of an electro-mechanical energy conversion element, such as a piezoelectric element, and an elastic body, and has a contact body that is in pressure contact with the vibrating body. The vibrating actuator is used as a vibration wave motor that utilizes friction generated by a driving force of vibration excited in the vibrating body to move the contact body relative to the vibrating body. Examples of types of vibrating actuator include a rotary vibrating actuator. The rotary vibrating actuator can be used for autofocusing and zooming functions of a camera to move a lens attached to a hollow part or can be used as a driving source for a panning and tilting operation.

The rotary vibrating actuator includes an annular vibrating body and an annular contact body that is in pressure contact with the vibrating body by a pressurizing member. The contact body can be divided into three functional parts, which are a contact part that is in contact with the vibrating body, a main annular part that is disposed on the outer diameter side of the contact body, and a spring part that connects the main annular part to the contact part. In general, the main annular part and the spring part are integrally molded in a form as one member by cutting operations and the like.

Japanese Patent Application Laid-Open No. 2000-245175 discusses an example of a contact body having a contact part formed using different materials, more specifically, the contact body having a friction member, as a contact part joined by adhesion or the like, made of a resin or a carbon fiber lower in density than a moving body made of an aluminum alloy or phosphor bronze.

According to the technique discussed in Japanese Patent Application Laid-Open No. 2000-245175, however, the friction member made of a low-density resin or a carbon fiber is used and thus the contact part is insufficient in abrasion resistance. In addition, as a result of the study, the inventors of the present application have found that in a case where an iron-based material, such as stainless steel, is used for the friction member to improve the abrasion resistance, the weight of the contact body increases due to the large density of the friction member, which decreases the natural vibration frequency of the spring part. In this case, the frequency of vibration excited in the vibrating body (hereinafter, referred to as driving frequency) and the natural vibration frequency of the contact body become close to each other, which leads to unintentional vibration in the contact body when the vibrating actuator is driven, and consequently, driving performance is degraded or abnormal sounds are occurred.

SUMMARY

Thus, the present disclosure is directed to a vibrating actuator that has a contact part having high abrasion resistance and with which degradation of driving performance and generation of abnormal sounds is prevented or reduced.

According to an aspect of the present disclosure, a vibrating actuator includes a vibrating body that has an elastic body of an annular shape and an electro-mechanical energy conversion element, and a contact body of an annular shape configured to be in contact with the elastic body, wherein the vibrating body and the contact body are configured to move relative to each other by vibration of the vibrating body, wherein the contact body has, each being of an annular shape, a base part, a thin plate part, and a support part that are formed integrally, and further has a friction member of an annular shape and made of an iron-based material, wherein the thin plate part extends from the base part toward an annular center axis of the base part, the support part is disposed at an end of the thin plate part, and the friction member is a member disposed to the support part as a member separate from the support part and is in contact with the elastic body, wherein density of the friction member is higher than density of the thin plate part, and wherein a weight ratio obtained by dividing a weight of the thin plate part by a total weight of the friction member and the support part is 0.5 to 1.5.

Further features of the present disclosure will become apparent from the following description of exemplary embodiments with reference to the attached drawings.

DESCRIPTION OF THE EMBODIMENTS

A vibrating actuator includes a vibrating body that has an elastic body of an annular shape and an electro-mechanical energy conversion element, and a contact body of an annular shape that is in contact with the elastic body, the vibrating body and the contact body being configured to move relative to each other by vibration of the vibrating body. The contact body has a base part of an annular shape, a thin plate part of an annular shape that extends from the base part toward an annular center axis of the base part, a support part of an annular shape that is disposed at an end of the thin plate part, and a friction member of an annular shape that is a member disposed to the support part as a member separate from the support part and is in contact with the elastic body. The base part, the thin plate part, and the support part are formed integrally, and the friction member is made of an iron-based material. In the vibrating actuator, density of the friction member is higher than density of the thin plate part, and wherein a weight ratio obtained by dividing a weight of the thin plate part by a total weight of the friction member and the support part is 0.5 to 1.5.

Hereinafter, exemplary embodiments will be described in detail with reference to the drawings.

Figure 1:
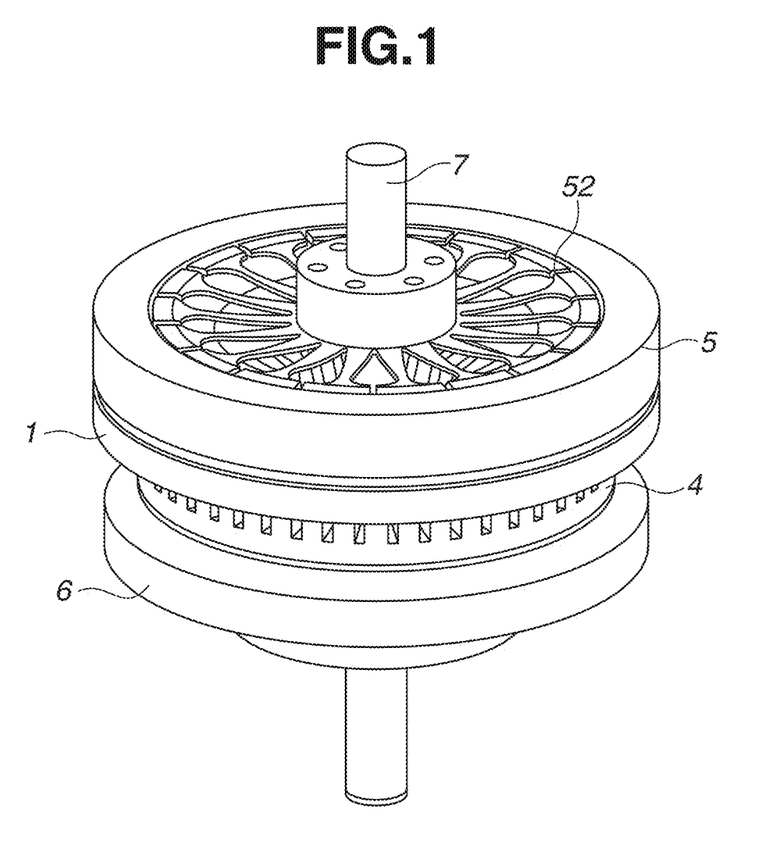
FIG. 1 is a perspective view illustrating a rotary vibrating actuator according to a first exemplary embodiment.
Figure 2:
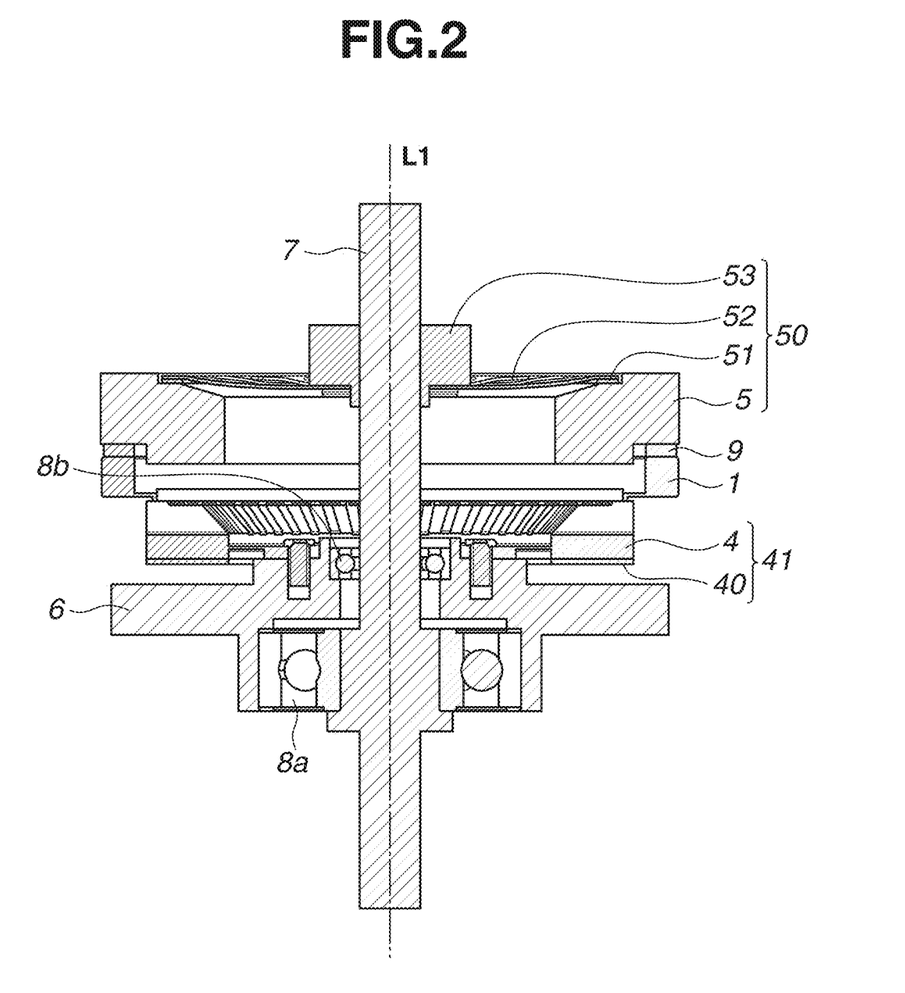
FIG. 2 is a cross-sectional view illustrating the rotary vibrating actuator according to the first exemplary embodiment.

FIG. 1 is a perspective view illustrating a rotary vibrating actuator according to a first exemplary embodiment. FIG. 2 is a cross-sectional view illustrating the rotary vibrating actuator according to the first exemplary embodiment, taken along a plane passing through a rotation center axis and parallel to the rotation center axis.

Referring to FIG. 2, a center line L1 is the rotation center axis of the rotary vibrating actuator. The rotary vibrating actuator includes a vibrating body 41 having an annular shape, a contact body 1 having an annular shape, and a pressurizing mechanism 50.

The vibrating body 41 is comprised of an elastic body 4 and a piezoelectric element 40, which is an electro-mechanical energy conversion element stuck on the elastic body 4 on a surface opposed to the contact body 1. The vibrating body 41 is fixed by screws to a vibrating body support member 6.

The pressurizing mechanism 50 is comprised of a pressurizing spring receiver member 5, a pressurizing spring receiving rubber 51, a pressurizing spring 52, and a pressurizing spring fixing part 53. The vibrating body 41 and the contact body 1 are concentrically arranged around a shaft 7 serving as a central shaft, and are in pressure contact with each other in a thrust direction of the shaft 7 by the pressurizing mechanism 50 fixed to the shaft 7. Specifically, the pressurizing spring 52 restricted in movement by the pressurizing spring fixing part 53 fixed to the shaft 7 presses the contact body 1 in the thrust direction via a vibration damping rubber 9, the pressurizing spring receiver member 5, and the pressurizing spring receiving rubber 51 to bring the contact body 1 and the vibrating body 41 into stable contact with each other.

In the present exemplary embodiment, the pressurizing spring 52 is a plate spring. The pressurizing spring fixing part 53 is fixed by set screws not illustrated (stop screws or grub screws) to the shaft 7. The shaft 7 is supported via rotation bearings 8a and 8b to be rotatable with respect to the vibrating body support member 6 supporting the vibrating body 41. In the present exemplary embodiment, the rotation bearings are ball bearings. Instead, slide bearings or thrust bearings can be used as far as the shaft 7 can be supported to be rotatable with respect to the vibrating body support member 6. This configuration allows the contact body 1 to be stably movable relative to a circumferential direction around the center line L1 serving as the rotation center axis with respect to the vibrating body 41.

The rotary vibrating actuator according to the present exemplary embodiment applies a drive voltage, which is an alternating-current voltage, to the piezoelectric element 40 via a power feeding member (not illustrated), to excite a driving vibration in the vibrating body 41. Although the driving vibration depends on the structure of the vibrating body 41, the piezoelectric element 40 is designed such that the excited driving vibration constitutes an n-order traveling wave (n=7 in the present exemplary embodiment) that travels in the circumferential direction of the vibrating body 41. The n-order driving vibration is a bending vibration in which the number of waves in the circumferential direction of the vibrating body 41 is n. The driving vibration generated in the vibrating body 41 drives the contact body 1 in the circumferential direction around the shaft 7 by the traveling wave generated in a contact part between the contact body 1 and the vibrating body 41.

Figure 3:
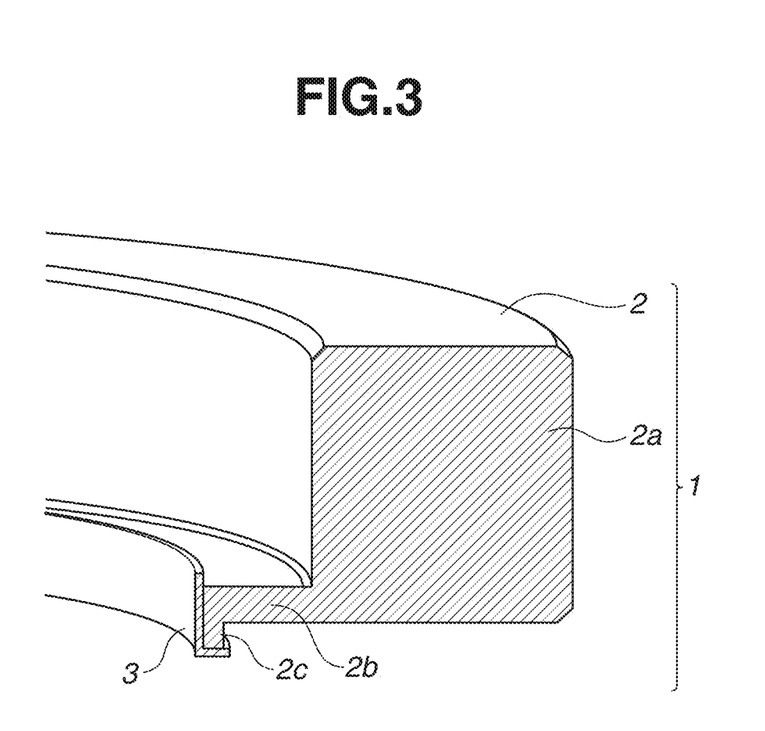
FIG. 3 is a cross-sectional view illustrating a contact body according to the first exemplary embodiment.

FIG. 3 is a cross-sectional view of the contact body 1 in the first exemplary embodiment of the present disclosure. The contact body 1 includes a rotating body 2 and a friction member 3 that is a part to be in contact with the vibrating body 41. The rotating body 2 includes a main body part 2a, a thin plate part 2b, and a support part 2c that supports the friction member 3. The friction member 3 is fixed to the support part 2c by adhesion or the like. In the present exemplary embodiment, the friction member 3 is made larger than the support part 2c in order to, even if an adhesive for fixing the friction member 3 is squeezed out from the adhesion part, prevent the state of contact between the friction member 3 and the vibrating body 41 from being affected by the adhesive.

Figure 4:
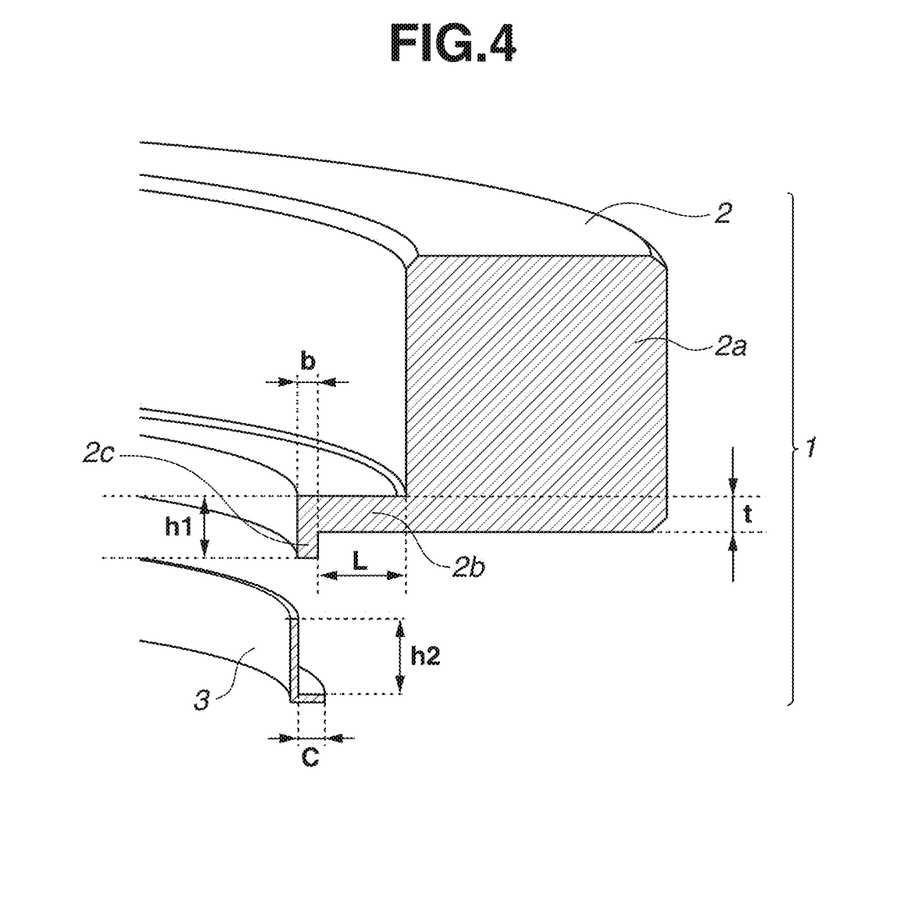
FIG. 4 is a diagram illustrating a structure of the contact body according to the first exemplary embodiment.

FIG. 4 is an exploded view of the contact body 1 in the first exemplary embodiment of the present disclosure. As illustrated in FIG. 4, the rotating body 2 is integrally formed by the main body part 2a, the thin plate part 2b, and the support part 2c. The thin plate part 2b has a length L and a thickness t. The thin plate part 2b of the rotating body 2 acts as a contact spring. Thus, it is desirable that the thin plate part 2b serving as the contact spring is formed of a material with a low Young's modulus, such as an aluminum alloy, with which, even with a manufacturing error, variations in spring constant can be prevented or reduced. In the present exemplary embodiment, the rotating body 2 is formed of an aluminum alloy.

The definition of the spring constant in the present disclosure will be described. As described above, the contact body 1 and the vibrating body 41 are in contact with each other in a state of being pressurized by the pressurizing spring 52, and the contact body 1 has the thin plate part 2b which is elastically deformed due to its low rigidity. The relationship between the force applied by the pressurizing spring 52 and the displacement of the thin plate part 2b in the pressurization direction at this time is defined as a spring constant in the present exemplary embodiment.

Properly managing the spring constant leads to an appropriate contact state between the contact body 1 and the vibrating body 41 at the time of driving.

The friction member 3 has an appropriately L-shaped cross section taken along a plane parallel to the rotation center axis. Thus, the friction member 3 can use two different surfaces as adhesion surfaces to improve the adhesion strength. Since friction member 3 and the vibrating body 41 are in friction contact with each other, it is desirable that the friction member 3 is made of an iron-based material, such as iron and steel, with high abrasion resistance. In the present exemplary embodiment, the material of the friction member 3 is stainless steel.

A method for machining the rotating body 2 and the friction member 3 will be described. The friction member 3 is preferably made of a material with high abrasion resistance. In the present exemplary embodiment, the friction member 3 can be manufactured by pressing and quenching a stainless-steel material. On the other hand, it is desirable that the rotating body 2 is made of a free-cutting material that can be machined at high accuracy. The rotating body 2 is manufactured by cutting an aluminum alloy which is more free-cutting than the friction member 3. That is, the material of the contact body 1 can be an aluminum alloy, and the material of the friction member 3 can be stainless steel.

The rotating body 2 can be subjected to a surface treatment, for example, an alumite treatment. The method for machining the friction member 3 is not limited to pressing but may be laser machining, electrical discharge machining, cutting, etching, or the like. In addition, the friction member 3 can be subjected to a thermal treatment, such as nitriding or carburizing. Besides a thermal treatment, the friction member 3 can be subjected to a hardening treatment by plating or the like.

Figure 5A:
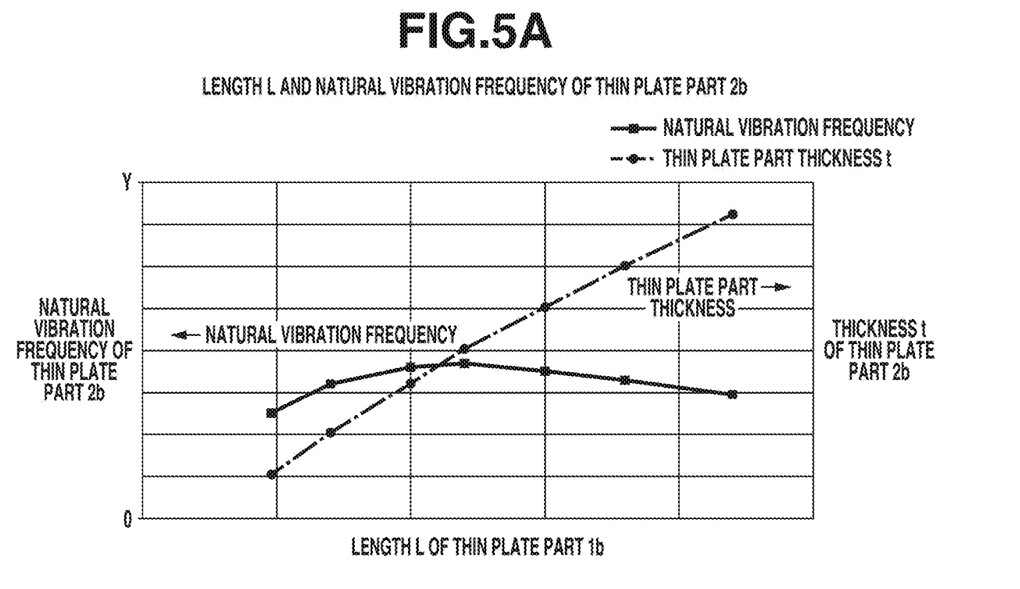
FIGS. 5A and 5B are graphs illustrating a relationship between a length of a thin plate part and a natural vibration frequency in a vibration mode in which the thin plate part deforms.
Figure 5B:
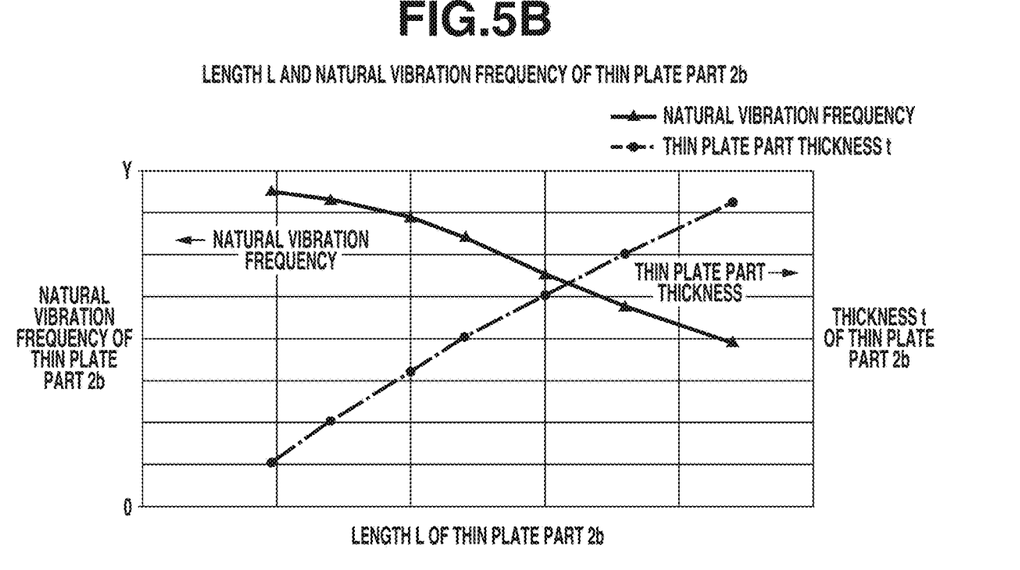

The structural issues of the contact body 1 in the present exemplary embodiment will be described. FIGS. 5A and 5B are graphs illustrating a relationship between the length L of the thin plate part 2b and a natural vibration frequency in a vibration mode in which the thin plate part 2b deforms. FIG. 5A indicates the natural vibration frequency of the thin plate part 2b configured such that the contact body 1 and the friction member 3 are formed as separate members, and FIG. 5B indicates the natural vibration frequency of the thin plate part 2b configured such that the contact body 1 and the friction member 3 are integrally formed.

The natural vibration frequency in the present exemplary embodiment refers to the frequency in the vibration mode having the lowest frequency among vibration modes in which the thin plate part 2b deforms when a modal analysis is performed. Specifically, the vibration modes in which the thin plate part 2b deforms are extracted by analyzing the thin plate part 2b under an analysis condition that the upper surface of the main body part 2a of the rotating body 2, that is, the surface of the main body part 2a in contact with the vibration damping rubber 9 is fixed.

The spring constants are uniform in each plot connected by a line in respective graphs. As the length L of the thin plate part 2b is larger, the thickness t of the thin plate part 2b indicated on the second axis on the right in the graph is larger. The first axes on the left in the graphs illustrated in FIGS. 5A and 5B indicate the natural vibration frequency in the same range with a lower limit of 0 and an upper limit of Y. The natural vibration frequency of the thin plate part 2b, illustrated in FIG. 5A, configured such that the contact body 1 and the friction member 3 are formed as separate members is lower than the natural vibration frequency of the thin plate part 2b, illustrated in FIG. 5B, configured such that the contact body 1 and the friction member 3 are integrally formed. That is, fixing the friction member 3 made of an iron-based material to the end of the thin plate part 2b decreases the natural vibration frequency of the thin plate part 2b.

In order to prevent or reduce degradation of the driving performance and generation of abnormal sounds, it is desired to increase the natural vibration frequency. Thus, in the configuration in which the contact body 1 and the friction member 3 are integrally formed, downsizing the thin plate part 2b is effective, more specifically, forming the thin plate part 2b thinner and shorter (decrease L and t) is effective.

The relationship between the length L in a radial direction of the thin plate part 2b and the thickness t of the thin plate part 2b in this configuration is represented in the form of a dot-and-dash line in FIG. 5B. The vibration frequency is represented in the form of a solid-line. The thinner and shorter the thin plate part 2b, the greater the natural vibration frequency.

However, as illustrated in FIG. 5A, it has been found that, in the configuration in which the friction member 3 is attached as a different member to the end of the thin plate part 2b, the thinner and shorter thin plate part 2b would cause an inflection point at which the natural vibration frequency starts to decrease.

As described above, in the contact body 1 illustrated in FIG. 3, the friction member 3 made of stainless steel higher in density than an aluminum alloy is attached to the support part 2c at the end of the thin plate part 2b, the natural vibration frequency of the thin plate part 2b becomes lower than that in the configuration in which the friction member 3 is formed not as a separate member but the rotor is formed of an aluminum alloy alone.

As described above, making the thin plate part 2b thinner and shorter, that is, downsizing the thin plate part 2b is a general technique to increase the natural vibration frequency. However, the inventor's study has revealed that, in the state where the friction member 3 is attached, forming the thin plate part 2b too small would decrease the natural vibration frequency. This is because the weight of the support part 2c and the friction member 3 at the end of the thin plate part 2b is heavier than the weight of the thin plate part 2b, and consequently, the influence of the support part 2c and the friction member 3 on the natural vibration frequency becomes greater. Thus, in order to maximize the natural vibration frequency in the configuration in which the friction member 3 is provided at the end of the rotating body 2 as in the first exemplary embodiment of the present disclosure, the relationship between the weight of the thin plate part 2b and the total weight of the support part 2c and the friction member 3 need to satisfy a specific condition.

Figure 6:
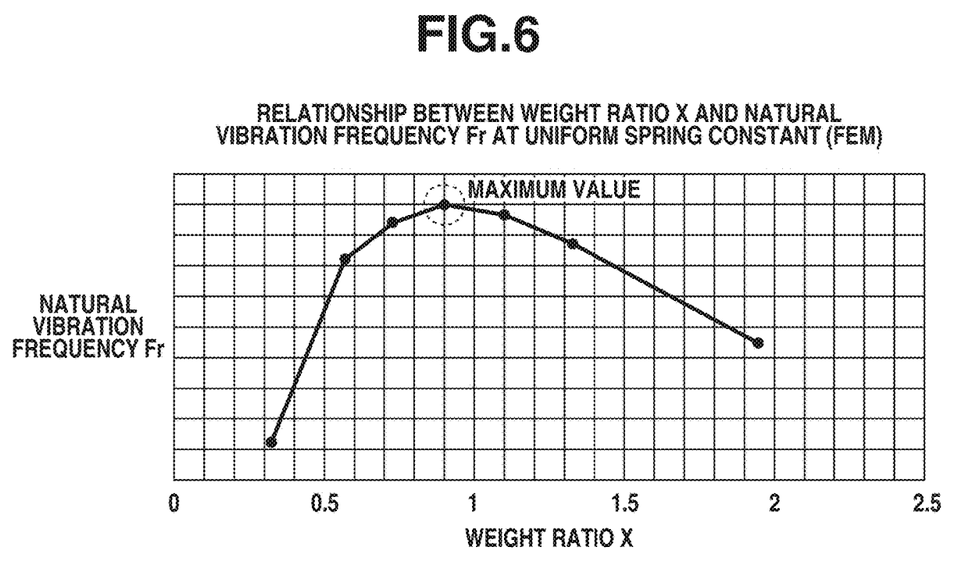
FIG. 6 is a graph illustrating a relationship between a weight ratio and a natural vibration frequency.

FIG. 6 illustrates the results of the inventor's study on the relationship between a weight ratio X and a natural vibration frequency Fr. The horizontal axis of the graph indicates the weight ratio X, which is the ratio of the weight of the thin plate part 2b to the total weight of the support part 2c and the friction member 3 where the thickness and the radial length of the thin plate part 2b were changed such that the spring constants of the thin plate part 2b in the rotating body 2 became uniform. That is, the weight ratio X is expressed as follows:

$$x = \frac{\text{the weight of the thin plate part } 2b}{\text{the weight of the support part } 2c + \text{the weight of the friction member } 3}. \quad (1)$$

The vertical axis of the graph indicates the natural vibration frequency Fr. The natural vibration frequency Fr is the frequency in the vibration mode having the lowest frequency among the vibration modes in which the thin plate part 2b deforms when the modal analysis was performed as described above. In the shape of the present exemplary embodiment, as illustrated in FIG. 6, the natural vibration frequency Fr was maximum when X≈0.9.

Figure 7:
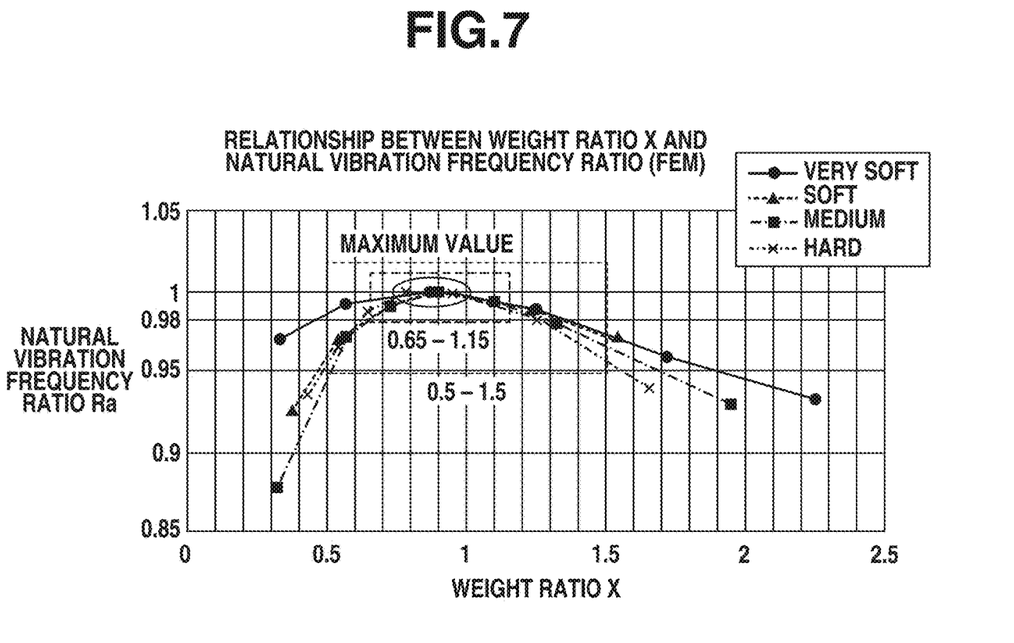
FIG. 7 is a graph illustrating effects of changes in a shape of a rotating body according to the first exemplary embodiment.

FIG. 7 illustrates the results of analysis performed under a plurality of conditions differentiated by spring constants. The spring constants were divided into four stages which are very soft, soft, medium, and hard, in ascending order, where there is about a 30-times gap between very soft and hard. The spring constant in FIG. 6 falls within medium, which is about ten times greater than very soft. Since the natural vibration frequency varies with changes in the spring constant, in the graph illustrated in FIG. 7, a natural vibration frequency ratio Ra is indicated on the vertical axis where the maximum value of the natural vibration frequency is 1 at each spring constant.

It can be seen from FIG. 7 that the natural vibration frequency Fr is maximum at X=0.8 to 0.9. That is, even if the spring constant is changed, the natural vibration frequency Fr can be maximum at a weight ratio in the range of X=0.8 to 0.9.

Eliminating or reducing a fluctuation in the natural vibration frequency occurring due to a change in shapes of the components in the rotating body 2 or the friction member 3 under the influence of manufacturing errors can lead to a rotary vibrating actuator with stable performance. As illustrated in FIG. 7, at the weight ratio X=0.5 to 1.5, the natural vibration frequency can be 0.95 (=95%) or more with respect to the maximum value of the natural vibration frequency. Furthermore, at the weight ratio X=0.65 to 1.15, the natural vibration frequency can be 0.98 (=98%) or more with respect to the maximum value of the natural vibration frequency. That is, a change in the natural vibration frequency can be further prevented or reduced at the weight ratio X=0.65 to 1.15.

Figure 9:
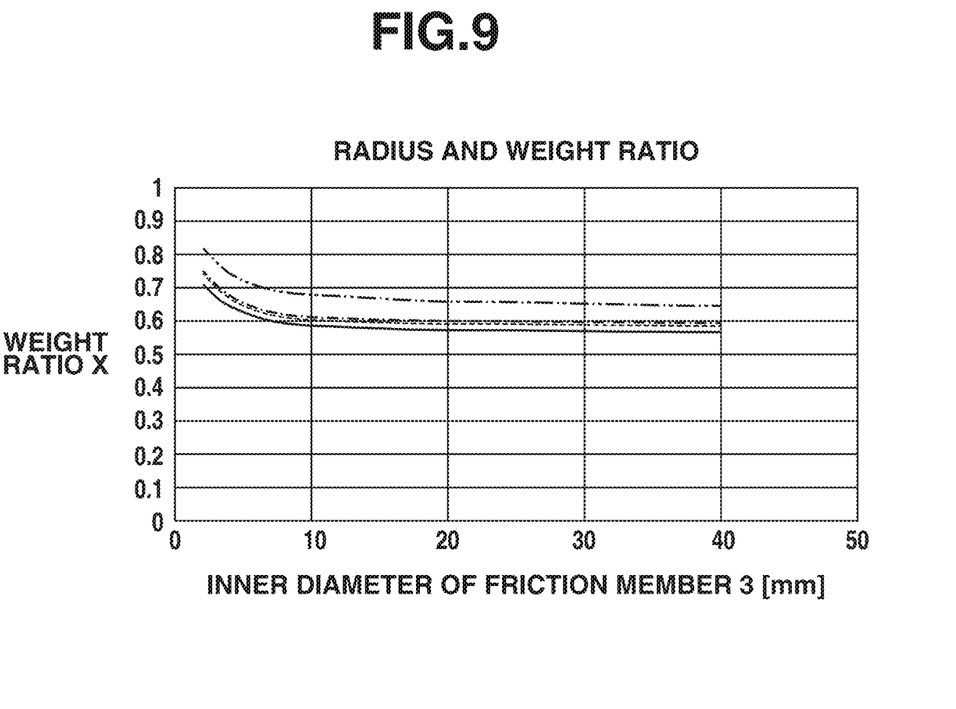
FIG. 9 is a graph illustrating a relationship between a slide radius and a weight radius according to the first exemplary embodiment.

FIG. 9 is a graph of changes in a weight ratio where an inner diameter of the friction member 3 was changed while the cross-sectional shapes of the friction member 3 and the rotating body 2 were not changed. The horizontal axis indicates the inner diameter of the friction member 3. The vertical axis indicates changes in the weight ratio X. FIG. 9 represents the changes in the weight ratio X with respect to the inner diameter of the friction member 3, and is not intended to determine the optimum solution of the weight ratio X. It can be seen from FIG. 9 that the weight ratio is substantially uniform when the inner diameter of the friction member 3 is 20 millimeter (mm) or more, and thus the weight ratio X can be determined from the cross-section shapes of the thin plate part 2b, the support part 2c, and the friction member 3 when the inner diameter is equal to or greater than a predetermined value. The weight ratio X does not necessarily take on the value at which the natural vibration frequency is maximum.

A method for defining the weight ratio X from factors other than the weights of the thin plate part 2b, the support part 2c, and the friction member 3 will be described. The weight ratio X can be expressed as X=S1×D1/(S2×D1+S3×D2), where the cross section area of the thin plate part 2b is S1, the cross section area of the support part 2c is S2, the cross section area of the friction member 3 is S3, the density of the rotating body 2 is D1, and the density of the friction member 3 is D2.

In order to prevent or reduce decrease in the natural vibration frequency in a configuration in which the friction member is positioned and fixed to the contact body to form the contact part, the friction member may be downsized to reduce its weight. However, if the friction member is downsized, and when an adhesive is used to fix the friction member to the contact body, the adhesion area become small, which lowers the strength of adhesion. Thus, the friction member needs to be large to a degree that the strength of adhesion can be secured.

In order to secure the strength of adhesion, the contact area between the friction member 3 and the support part 2c is desirably large. In the case of fixing the friction member 3 to the support part 2c using an adhesive, if the adhesive is squeezed out from the friction member 3 to the area where the friction member 3 is in contact with the vibrating body 41, the adhesive may inhibit driving. Thus, the friction member 3 is desirably longer than the support part 2c in the radial direction. The dimensions of these parts will be described with reference to FIG. 4. In the present exemplary embodiment, a radial length c of the friction member 3 on the adhesion surface side is preferably 1.2 times or more a radial length b of the support part 2c (c/b≥1.2). An extension part of the friction member 3 with respect to the support part 2c can be used as an adhesive retainer. If the radial length c of the friction member 3 is excessively longer than the radial length b of the support part 2c, the portion of the friction member 3 radially extending beyond the support part 2c may be largely displaced when being pressurized, which may change the contact state. Thus, the radial length c of the friction member 3 is desirably two times or less the radial length b of the support part 2c (c/b≤2). For example, when the radial length b of the support part 2c is 0.3 mm, the radial length c of the friction member 3 is 0.36 mm or more and 0.6 mm or less.

That is, the width of the radial area of the friction member 3 in contact with the support part 2c is 1.2 times or more and 2 times or less of the width of the radial area of the friction member 3.

Similarly, the contact area in the axial direction between the friction member 3 and the support part 2c is increased to secure the strength of adhesion between the friction member 3 and the support part 2c. At the same time, it is necessary to prevent the adhesive from spreading to the contact area between the friction member 3 and the vibrating body 41, to prevent or reduce influence of the adhesive squeezed out. Thus, it is necessary to form a height h2 of the friction member 3 on the adhesion surface side larger than a height h1 of the support part 2c, and provide an adhesive retainer on a surface of the support part 2c facing a contact surface between the contact body 1 and the vibrating body 41. In the present exemplary embodiment, the height h2 of the friction member 3 on the adhesion surface side is set to 1.4 times larger than the height h1 of the support part 2c (h2/h1=1.4). In order for the difference between the height h2 of the friction member 3 and the height h1 of the support part 2c, serving as an adhesive retainer, h2/h1 can be 1.2 times or more, and is desirably 1.8 times or less because if the friction member 3 is too large, the natural vibration frequency will decrease. For example, if the height h1 of the support part 2c is 0.5 mm, the height h2 of the friction member 3 is 0.6 mm or more and 0.9 mm or less.

A configuration of a camera platform apparatus (turning apparatus) as an example of an apparatus including at least two or more vibrating actuators according to the present exemplary embodiment will be described as a second exemplary embodiment.

Figure 8A:
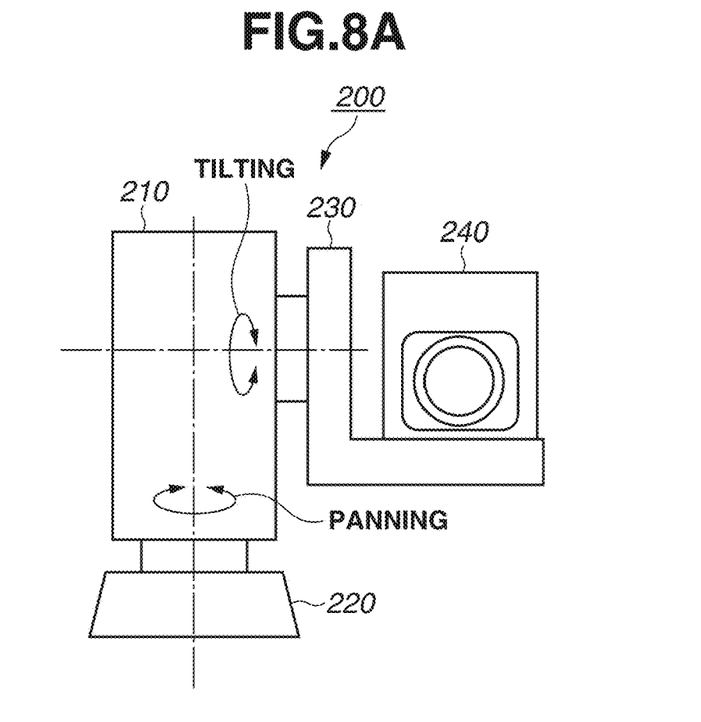
FIGS. 8A and 8B are diagrams illustrating a camera platform apparatus according to a third exemplary embodiment.
Figure 8B:
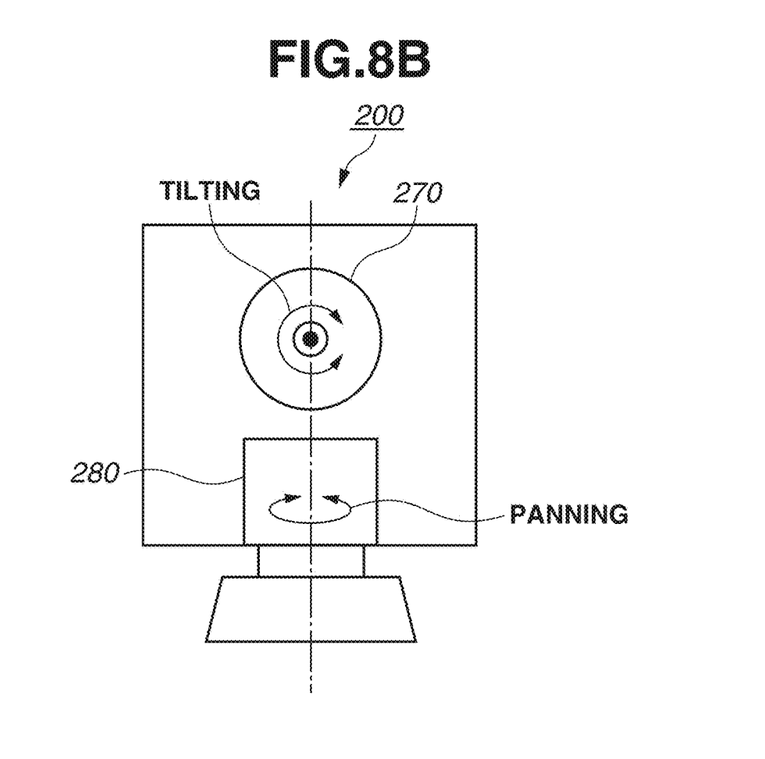

FIG. 8A is a front view of a camera platform apparatus 200 according to the present exemplary embodiment, and FIG. 8B is a side view of the camera platform apparatus 200 according to the present exemplary embodiment.

The camera platform apparatus 200 has a head part 210, a base part 220, an L angle 230, and an imaging device 240. The two vibrating actuators of the present exemplary embodiment are arranged in the head part 210.

A vibrating actuator 280 for panning has an output part coupled to the base part 220. The vibrating actuator 280 rotationally drives the head part 210 to pan relative to the base part 220.

A vibrating actuator 270 for tilting has an output part coupled to the L angle 230. The vibrating actuator 270 rotationally drives The L angle 230 to tilt relative to the head part 210.

The imaging device 240 attached to the L angle 230 is a camera for capturing moving images and still images. The imaging device 240 can be driven by the vibration actuators 270 and 280 to pan and tilt while capturing images.

As described above, the vibrating actuator of the present disclosure can be used as a drive source of a camera platform apparatus.

The present exemplary embodiment can be applied to a vibrating actuator, such as an ultrasonic motor. The present exemplary embodiment may also be applied in a configuration of an optical device including an optical element and the vibrating actuator described above in the driving part. Furthermore, the present disclosure may be used for an electronic device including a base material and the vibrating actuator described above on the base material.

According to the present disclosure, it is possible to increase the natural vibration frequency of the contact body even in a case where a high density material, such as an iron-based material, is used for the friction member, whereby a vibrating actuator that has the contact part having high abrasion resistance and can prevent or reduce degradation of driving performance and generation of abnormal sounds can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-125343, filed Jul. 30, 2021, which is hereby incorporated by reference herein in its entirety.

What is claimed is:

1. A vibrating actuator comprising:
 a vibrating body that has an elastic body of an annular shape and an electro-mechanical energy conversion element; and
 a contact body of an annular shape configured to be in contact with the elastic body, wherein the vibrating body and the contact body are configured to move relative to each other by vibration of the vibrating body,
 wherein the contact body has, each being of an annular shape, a base part, a thin plate part, and a support part that are formed integrally, and further has a friction member of an annular shape and made of an iron-based material,
 wherein the thin plate part extends from the base part toward an annular center axis of the base part, the support part is disposed at an end of the thin plate part, and the friction member is a member disposed to the support part as a member separate from the support part and is in contact with the elastic body,
 wherein density of the friction member is higher than density of the thin plate part, and
 wherein a weight ratio obtained by dividing a weight of the thin plate part by a total weight of the friction member and the support part is 0.5 to 1.5.

2. The vibrating actuator according to claim 1, wherein the friction member is formed of a friction member thin plate part extending in a radial direction and an axial direction.

3. The vibrating actuator according to claim 1, wherein a material of the contact body is an aluminum alloy, and a material of the friction member is stainless steel.

4. The vibrating actuator according to claim 1, wherein the weight ratio is 0.65 to 1.15.

5. The vibrating actuator according to claim 1, wherein a width of a radial area of the friction member in contact with the support part is 1.2 times or more and 2 times or less of a width of a radial area of the support part.

6. The vibrating actuator according to claim 1, wherein a width of an axial area of the friction member in contact with the support part is 1.2 times or more and 1.8 times or less of a width of an axial area of the support part.

7. The vibrating actuator according to claim 1, wherein an inner diameter of the friction member is 20 millimeter (mm) or more.

8. The vibrating actuator according to claim 1, wherein the weight ratio is represented as:

$$X = S1 \times D1 / (S2 \times D1 + S3 \times D2),$$

where X is the weight ratio, S1 is a cross section area of the thin plate part taken along a plane passing through a rotation center axis of the vibrating actuator and parallel to an axial direction, S2 is a cross section area of the support part taken along the plane, S3 is a cross section area of the friction member taken along the plane, D1 is density of the contact body, and D2 is the density of the friction member.

9. An optical device comprising:
 an optical element; and
 the vibrating actuator according to claim 1,
 wherein the vibrating actuator is provided to a driving part.

10. An electronic device comprising:
 a base material; and
 the vibrating actuator according to claim 1,
 wherein the vibrating actuator is provided to the base material.

* * * * *